United States Patent
Cheng

(10) Patent No.: US 7,990,704 B2
(45) Date of Patent: Aug. 2, 2011

(54) ELECTRONIC DEVICE WITH HEAT DISSIPATING STRUCTURE

(75) Inventor: Hao-Der Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/633,670

(22) Filed: Dec. 8, 2009

(65) Prior Publication Data

US 2011/0110035 A1 May 12, 2011

(30) Foreign Application Priority Data

Nov. 6, 2009 (CN) .......................... 2009 1 0309379

(51) Int. Cl. 
*H05K 7/20* (2006.01)

(52) U.S. Cl. ............... 361/690; 361/679.48; 361/679.5; 361/695; 361/719; 165/80.3; 165/104.33; 165/122

(58) Field of Classification Search ............. 361/679.46, 361/679.47, 679.48, 679.49, 479.53, 690–697, 361/700–712, 715, 719, 720, 727; 165/80.2, 165/80.3, 80.4, 80.5, 104.121–126, 104.33, 165/104.34, 185; 257/706–727; 174/16.3, 174/252; 454/184

See application file for complete search history.

(56) References Cited

U.S. PATENT DOCUMENTS

| | | | |
|---|---|---|---|
| 6,215,662 B1 * | 4/2001 | Peter et al. ..................... | 361/704 |
| 6,442,024 B1 * | 8/2002 | Shih ............................... | 361/695 |
| 6,888,725 B2 * | 5/2005 | Kubo et al. .................... | 361/719 |
| 6,958,914 B2 * | 10/2005 | Hoss .............................. | 361/704 |
| 7,027,299 B2 * | 4/2006 | Wrycraft et al. .............. | 361/695 |
| 7,206,206 B2 * | 4/2007 | Lin et al. ...................... | 361/719 |
| 7,310,226 B2 * | 12/2007 | Chen et al. .................... | 361/695 |
| 7,391,618 B2 * | 6/2008 | Fujiya et al. .................. | 361/727 |
| 7,405,932 B2 * | 7/2008 | Vinson et al. ................. | 361/695 |
| 7,558,065 B2 * | 7/2009 | Fang et al. .................... | 361/700 |
| 7,623,346 B2 * | 11/2009 | Fujiya et al. .................. | 361/694 |
| 2008/0041562 A1 * | 2/2008 | Bhatia .......................... | 165/80.3 |

* cited by examiner

*Primary Examiner* — Michael V Datskovskiy

(74) *Attorney, Agent, or Firm* — Zhigang Ma

(57) ABSTRACT

An electronic device includes a first and a second air passages. A first and a second electronic components locate in the first and second air passages, respectively. A first heat sink includes a first heat dissipation portion contacting the first electronic component and located in the first air passage and a second heat dissipation portion located in the second air passage. A second heat sink includes a first heat dissipation portion contacting the second electronic component and located in the second air passage and a second heat dissipation portion located in the first air passage. The first heat dissipation portion of the first heat sink aligns with the second heat dissipation portion of the second heat sink and the second heat dissipation portion of the first heat sink aligns with the first heat dissipation portion of the second heat sink along a flowing direction of the t air passage.

9 Claims, 3 Drawing Sheets

ELECTRONIC DEVICE WITH HEAT DISSIPATING STRUCTURE

BACKGROUND

1. Technical Field

The present disclosure relates to electronic devices and, more particularly, to an electronic device with heat dissipating structure.

2. Description of Related Art

Generally, an electronic device such as a server may have two spaced independent CPUs located in two parallel air passages. Two heat sinks thermally contact the two CPUs, respectively to dissipate heat generated by the two CPUs. Other electronic components partially baffle airflow through both the two air passages. When the airflow flows through the two air passages from around the electronic components, throughput rate of the airflow through the two air passages are different and temperature of the airflow of the two air passages are different. Thus, the two CPUs are not cooled with equal efficiency and may result in unstable performance of the electronic device.

What is needed, therefore, is an electronic device having good heat dissipation efficiency and stable performance.

DETAILED DESCRIPTION

Figure 1:
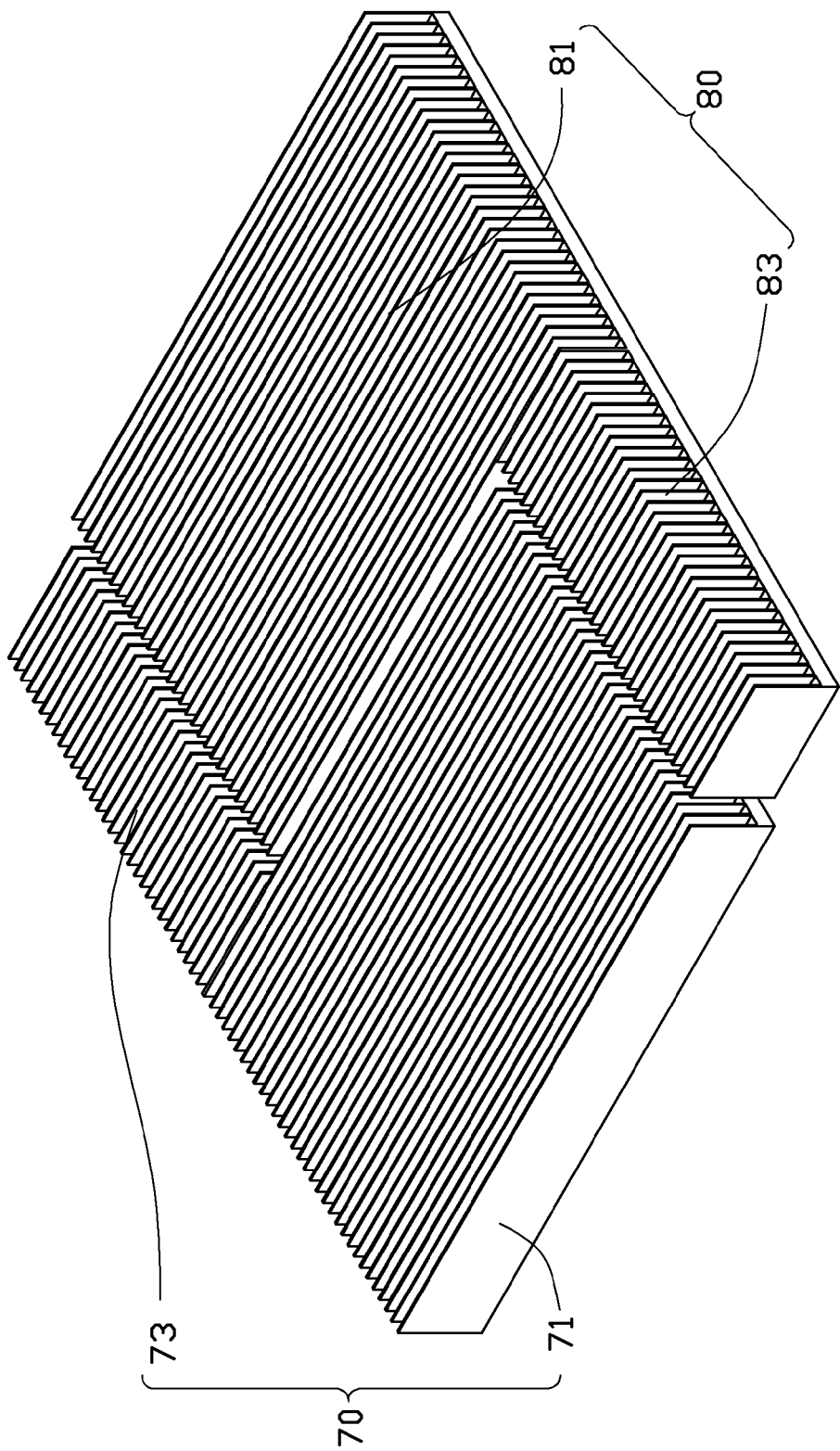
FIG. 1 is an assembly view of a first heat sink and a second heat sink of an electronic device in accordance with an embodiment of the present disclosure.
Figure 2:
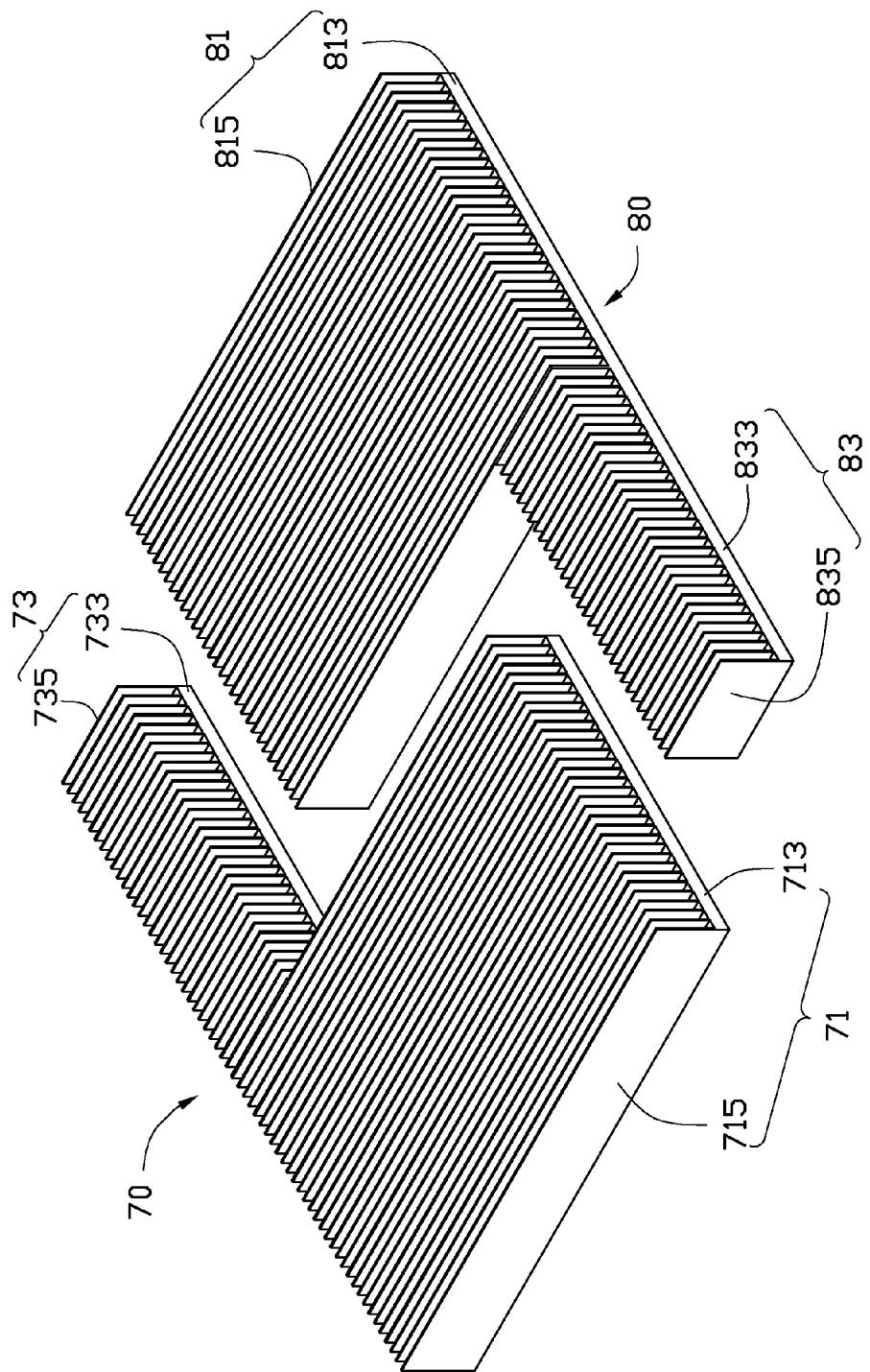
FIG. 2 is similar to FIG. 1, but the first heat sink and the second heat sink spaced from each other for purposes of illustration.
Figure 3:
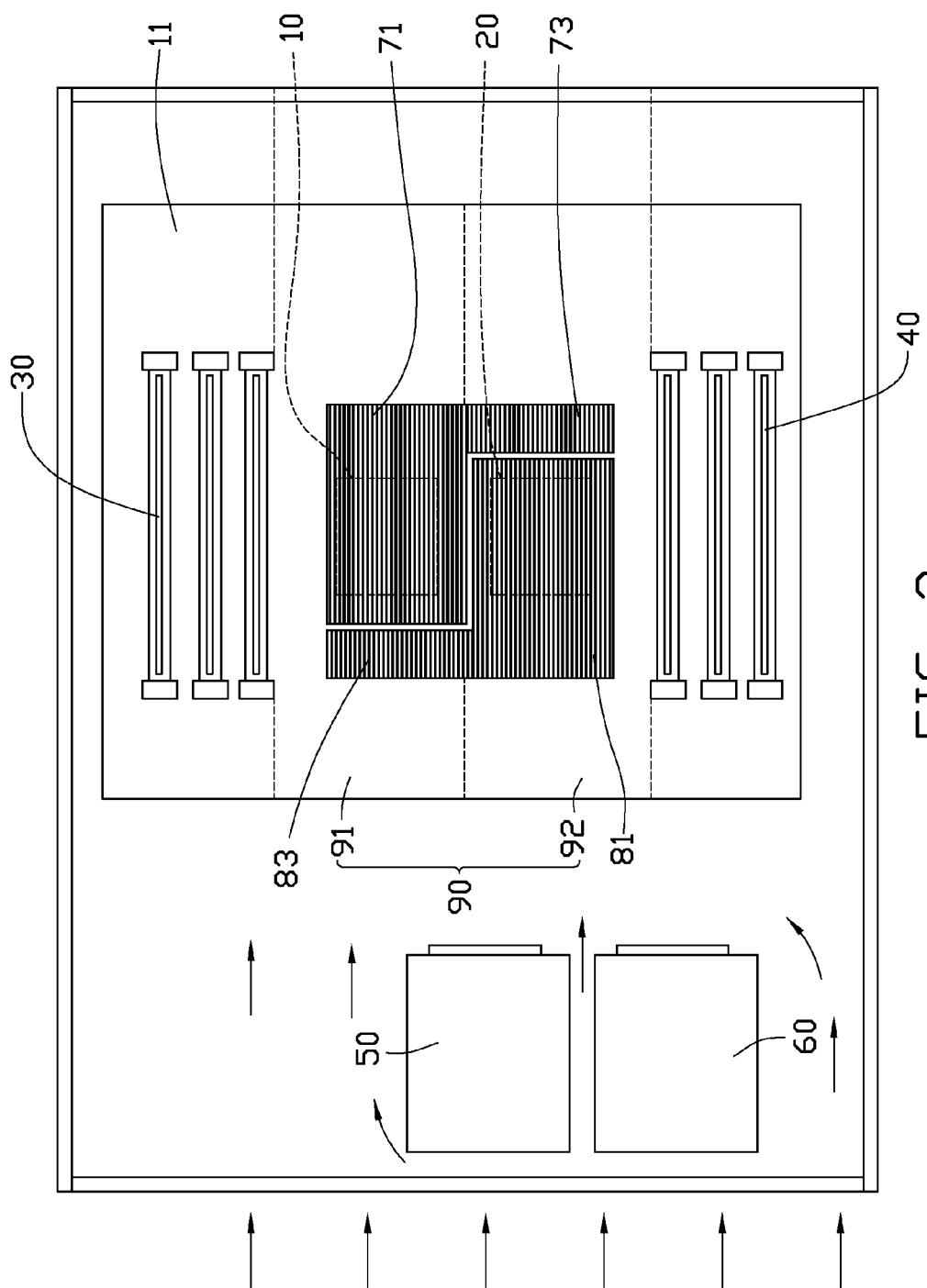
FIG. 3 is a schematic view of the electronic device of the present disclosure.

FIGS. 1-3 illustrate an electronic device of the present disclosure. The electronic device comprises a printed circuit board (PCB) 11. A first central process unit (CPU) 10 and a second CPU 20 are mounted on the PCB 11. Two spaced memories 30, 40 are located at lateral sides of the PCB 11 and cooperatively define an air passage 90 therebetween. The first and second CPUs 10, 20 are located in the air passage 90. Two spaced hard disks 50, 60 are located at a front side of the air passage 90 and are parallel to each other. A first heat sink 70 and a second heat sink 80 thermally contact the first and second CPUs 10, 20, respectively.

The air passage 90 is divided into a first air passage 91 and a second air passage 92 each of which runs along a lengthwise direction thereof in parallel to each other. The first CPU 10 is located in the first air passage 91. The second CPU 20 is located in the second air passage 92. The hard disk 50 partially baffles airflow through both the first air passage 91 and second air passage 92. The hard disk 60 partially baffles airflow through second air passage 92. When the airflow flows through the first and second air passages 91, 92 from around the hard disks 50, 60, the throughput rate of the airflow through the second air passage 92 is smaller than that of the first air passage 91 because of the partial baffling of both the hard disks 50, 60.

The first heat sink 70 has an L-shaped configuration and comprises a first heat dissipation portion 71 and a second heat dissipation portion 73 perpendicularly extending from a side of the first heat dissipation portion 71. The first heat dissipation portion 71 comprises a rectangular base 713 and a plurality of elongated fins 715 extending upwardly from a top surface of the base 713. The fins 715 are parallel to and spaced from each other. A length of each of the fins 715 is equal to that of the base 713. The second heat dissipation portion 73 comprises a rectangular base 733 and a plurality of spaced fins 735 extending upwardly from a top surface of the base 733. The base 733 is shorter than the base 713. The base 733 is smaller than the base 713, and perpendicularly extends from a lateral end of the base 713. The fins 735 are parallel to each other and parallel to the fins 715. A length of each of the fins 735 is equal to that of the base 733 and smaller than that of the base 713. The base 733 is wider than the base 713.

The second heat sink 80 and the first heat sink 70 have the same configuration. The second heat sink 80 comprises a first heat dissipation portion 81, equivalent to the first heat dissipation portion 71 of the first heat sink 70, and a second heat dissipation portion 83, equivalent to the first heat dissipation portion 73 of the first heat sink 70. The first heat dissipation portion 81 comprises a rectangular base 813 and a plurality of elongated fins 815 extending upwardly from a top surface of the base 813. The second heat dissipation portion 83 comprises a rectangular base 833 and a plurality of spaced fins 835 extending upwardly from a top surface of the base 833.

Referring to FIG. 3 again, the two heat sinks 70 and 80 are arranged in a compensatory manner to cooperatively form a rectangular shape, wherein the first heat dissipation portion 81 of the second heat sink 80 is located in the second air passage 92. The base 813 of the first heat dissipation portion 81 covers the second CPU 20 and a central portion thereof thermally contacts the second CPU 20. The second heat dissipation portion 83 of the second heat sink 80 extends from the first heat dissipation portion 81 and is located in the first air passage 91. The first heat dissipation portion 71 of the first heat sink 70 is located in the first air passage 91 and behind the second heat dissipation portion 83 of the second heat sink 80. The base 713 of the first heat dissipation portion 71 covers the first CPU 10 and a central portion thereof thermally contacts the first CPU 10. The second heat dissipation portion 73 of the first heat sink 70 is located in the second air passage 92 and behind the first heat dissipation portion 81. The first and second heat sinks 70, 80 are spaced from each other and positioned to cooperatively form a rectangle.

When the electronic device is operating, the first heat dissipation portion 71 absorbs heat of the first CPU 10 and the first heat dissipation portion 81 absorbs heat of the second CPU 20. As stated before, the airflow flows from along the hard disks 50, 60 through the air passage 90. The throughput rate of airflow through the second air passage 92 is smaller than that of the first air passage 91 because of the partial baffling of the hard disks 50, 60. Additionally, temperature of the airflow of the second air passage 92 is higher than that of the first air passage 91 because the airflow is heated by both the hard disks 50, 60.

In this disclosure, the second heat dissipation portion 83 of the second heat sink 80 is located in the first air passage 91 adjacent the part of the dissipation portion 71 of the first heat sink 70 nearest the hard disks 50,60. The first dissipation portion 81 of second heat sink 80 is located in the second air passage 92 adjacent the part of the second heat dissipation portion 73 of the first heat sink 70 nearest the hard disks 50, 60. The airflow flows through the second heat sink 80 firstly and then flows through the first heat sink 70 to balance the heat dissipation efficiency of the first and second heat sinks 70, 80. The heat dissipating efficiency of the first heat sink 70 is equal to/approaches that of the second heat sink 80. Therefore temperature of the first CPU 10 approaches that of the second CPU 20 allowing more stable performance of the electronic device.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a first electronic component;
   a second electronic component spaced from and aligned with the first electronic component;
   a first heat sink comprising a first heat dissipation portion thermally contacting the first electronic component and a second heat dissipation portion aligned with the second electronic component, the first heat dissipation portion of the first heat sink being larger than the second heat dissipation portion of the first heat sink, the first heat dissipation portion of the first heat sink defining a plurality of air paths across the first heat sink; and
   a second heat sink comprising a first heat dissipation portion thermally contacting the second electronic component and a second heat dissipation portion aligned with the first electronic component, the first heat dissipation portion of the second heat sink being larger than the second heat dissipation portion of the second heat sink, the first heat dissipation portion of the second heat sink defining a plurality of air paths across the second heat sink, the second heat dissipation portion of the first heat sink extending towards the second heat sink and being aligned with the air paths of the first heat dissipation portion of the second heat sink;
   wherein the first heat dissipation portion of the first heat sink is aligned with the second heat dissipation portion of the second heat sink along the air paths of the first heat dissipation portion of the first heat sink, and the second heat dissipation portion of the first heat sink is aligned with the first heat dissipation portion of the second heat sink along the air paths of the first heat dissipation portion of the second heat sink.

2. The electronic device as claimed in claim 1, wherein the first and second heat sinks are spaced from each other and positioned to cooperatively form a rectangle.

3. The electronic device as claimed in claim 2, wherein the first heat dissipation portion of the first heat sink comprises a base, and the second heat dissipation portion of the first heat sink comprises a base extending from the base of the first heat dissipation portion of the first heat sink.

4. The electronic device as claimed in claim 3, wherein a plurality of spaced fins extend upwardly from the bases of the first and second heat dissipation portions of the first heat sink.

5. The electronic device as claimed in claim 4, wherein the first heat sink has an L-shaped configuration.

6. The electronic device as claimed in claim 1, wherein the first heat dissipation portion of the second heat sink comprises a base, and the second heat dissipation portion of the second heat sink comprises a base extending from the base of the first heat dissipation portion of the second heat sink.

7. The electronic device as claimed in claim 6, wherein a plurality of spaced fins extend upwardly from the bases of the first and second heat dissipation portions of the second heat sink.

8. The electronic device as claimed in claim 5, wherein the second heat sink has an L-shaped configuration.

9. The electronic device as claimed in claim 1, wherein the first and second heat sinks have the same configuration.

\* \* \* \* \*